(12) United States Patent
Poucher et al.

(10) Patent No.: US 9,466,666 B2
(45) Date of Patent: Oct. 11, 2016

(54) LOCALIZED STRAIN RELIEF FOR AN INTEGRATED CIRCUIT

(71) Applicant: ANALOG DEVICES GLOBAL, Hamilton (BM)

(72) Inventors: Patrick F. M. Poucher, Raheen (IE); Padraig L. Fitzgerald, Mallow (IE); John Jude O'Donnell, Quin (IE); Oliver J. Kierse, Killaloe (IE); Denis M. O'Connor, Banteer (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 13/740,677

(22) Filed: Jan. 14, 2013

(65) Prior Publication Data

US 2013/0292793 A1  Nov. 7, 2013

Related U.S. Application Data (60) Provisional application No. 61/642,204, filed on May 3, 2012.

(51) Int. Cl.

| H01L 23/12  | (2006.01) |
| H01L 29/06  | (2006.01) |
| H01L 21/764 | (2006.01) |
| H01L 23/00  | (2006.01) |
| H01L 23/16  | (2006.01) |
| H01L 23/31  | (2006.01) |

(52) U.S. Cl.
CPC ......... *H01L 29/0649* (2013.01); *H01L 21/764* (2013.01); *H01L 23/16* (2013.01); *H01L 23/3135* (2013.01); *H01L 23/3178* (2013.01); *H01L 23/562* (2013.01); *H01L 2924/0002* (2013.01)

(58) Field of Classification Search
CPC .................... H01L 21/764; H01L 29/0649
USPC .................................. 257/669, 704
See application file for complete search history.

(56) References Cited

U.S. PATENT DOCUMENTS

| 4,660,027 A | 4/1987 | Davis |
| 5,508,231 A | 4/1996 | Ball et al. |
| 5,644,168 A | 7/1997 | Libres et al. |

(Continued)

FOREIGN PATENT DOCUMENTS

EP   2 284 640 A1   2/2011

OTHER PUBLICATIONS

Gillot et al., "Wafer level thin film encapsulation for MEMS," Conference on High Density Microsystem Design and Packaging and Component Failure Analysis, 2005, 4 pages.

(Continued)

*Primary Examiner* — Daniel Whalen
(74) *Attorney, Agent, or Firm* — Knobbe, Martens, Olson & Bear LLP (57) ABSTRACT

An integrated circuit may include a semiconductor die having a trench formed in a surface of the semiconductor die. One or more circuit components may be formed on the surface of the semiconductor die. The trench can extend into the semiconductor die next to at least one circuit component. The trench may surround the circuit component partially or wholly. The trench may be filled with a material having a lower bulk modulus than the semiconductor die in which the trench is formed.

26 Claims, 7 Drawing Sheets

IC 200 (Portion)

CROSS-SECTION VIEW

(56) References Cited

U.S. PATENT DOCUMENTS

| | | |
|---|---|---|
| 6,323,550 B1 | 11/2001 | Martin et al. |
| 6,894,229 B1 | 5/2005 | Cheah |
| 7,176,559 B2 | 2/2007 | Ho et al. |
| 7,232,692 B2 | 6/2007 | Guenter et al. |
| 7,435,624 B2 | 10/2008 | Chiu et al. |
| 7,531,424 B1 | 5/2009 | Pai |
| 7,763,965 B2 | 7/2010 | Webb |
| 7,897,512 B2 | 3/2011 | Cho et al. |
| 8,058,677 B2 | 11/2011 | Summerfelt et al. |
| 2006/0024857 A1 | 2/2006 | Chen et al. |
| 2008/0197514 A1 | 8/2008 | Goida |
| 2008/0251866 A1 | 10/2008 | Belt et al. |
| 2009/0026526 A1* | 1/2009 | Cho et al. .............. 257/316 |
| 2010/0001377 A1* | 1/2010 | Kato et al. ............. 257/620 |
| 2010/0084722 A1* | 4/2010 | Kramer et al. ......... 257/415 |
| 2010/0327421 A1 | 12/2010 | Luan |
| 2012/0168945 A1* | 7/2012 | Wang et al. ............ 257/738 |
| 2014/0217613 A1 | 8/2014 | Udrea-Spenea et al. |
| 2014/0353772 A1 | 12/2014 | Stermer et al. |
| 2015/0035130 A1 | 2/2015 | How |
| 2015/0123256 A1 | 5/2015 | Kierse et al. |

OTHER PUBLICATIONS

Office Action mailed Jan. 30, 2015 issued in U.S. Appl. No. 14/072,572, in 18 pages.

Final Office Action mailed Jul. 30, 2015 issued in U.S. Appl. No. 14/072,572, in 15 pages.

Office Action mailed Dec. 3, 2015 issued in U.S. Appl. No. 14/072,572, in 13 pages.

Office Action mailed May 19, 2016 issued in U.S. Appl. No. 14/072,572, in 17 pages.

* cited by examiner

FIG. 3

TOP-DOWN VIEW

Y-Y Stress (MPa)

LOCALIZED STRAIN RELIEF FOR AN INTEGRATED CIRCUIT

CROSS-REFERENCE TO RELATED APPLICATION

This application claims the benefit of priority afforded by U.S. Provisional Application Ser. No. 61/642,204, filed May 3, 2012, the entirety of which is incorporated by reference herein.

BACKGROUND

An integrated circuit ("IC") typically encounters mechanical strain as a result of differences in physical properties of different materials which constitute an IC package. The materials include semiconductor materials, oxide materials, metals, and various plastics to encapsulate the IC. These materials have different temperature coefficients of expansion ("TCE"), hygroscopicity and viscoelasticity, which apply mechanical strains to the IC over variations in temperature, humidity, and time.

The mechanical strain can causes change in the electrical characteristics of circuit components within an IC. During manufacture, calibration can be performed in an attempt to minimize the effects of mechanical strain on the electrical characteristics. After manufacture, however, an IC is still subject to changes due to temperature, humidity, and time. Further, external forces on an IC package will impact strain on the IC. For example, external forces may be applied to the IC by mechanical handlers during testing of the IC.

Accordingly, there is a need in the art for a technique to minimize changes in electrical characteristics for electrically sensitive circuit components within an IC package due to strain.

DETAILED DESCRIPTION

Embodiments of the present invention may provide a trench formed in a semiconductor material near one or more circuit component(s) of an IC. The trench may surround the circuit component partially or wholly. The trench may be filled with a material having a lower bulk modulus than that of the semiconductor material in which the trench is formed. The trench and fill material may isolate the component(s) from one or more strains on the IC and therefore minimize variations in electrical operating characteristics of the circuit component(s). In various embodiments, a cap may cover the trench and the isolated circuit components. A fill space may be formed between the cap, the trench and the isolated circuit components. In an embodiment, the fill space may be filled with a gas or air. In another embodiment, the fill space may be partially filled with a liquid, gel or other material having a lower bulk modulus than the semiconductor material. In yet another embodiment, the fill space may be placed under a vacuum.

Circuit components such as transistors exhibit varied electrical operating characteristics, such as electrical drift, when they are subjected to mechanical strains due to temperature, humidity, or physical force. To minimize the electrical operating variations of such components within an IC, one or more trenches may be formed near the components to isolate them from strains that may be present on the IC.

Figure 1:
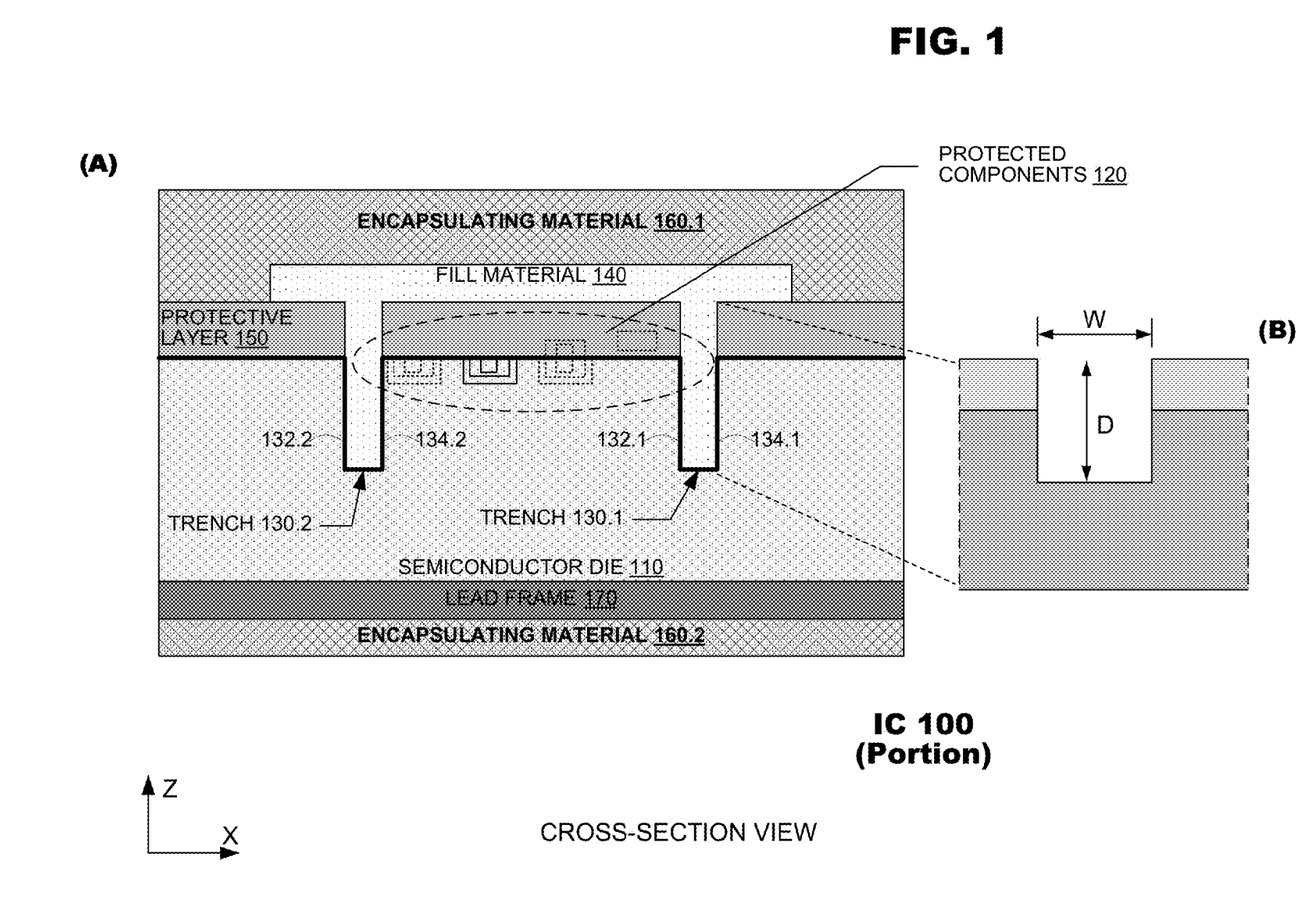
FIG. 1 illustrates an IC according to an embodiment of the present invention.

FIG. 1 illustrates an IC 100 according to an embodiment of the present invention. The IC 100 may include a semiconductor die 110 having circuit components 120 formed thereon and one or more trenches 130.1, 130.2 formed near the circuit components 120. The trenches 130.1, 130.2 may be formed by removing portions of the semiconductor die 110, which isolates material on each side 132.1 of a trench 130.1 from mechanical strain that otherwise would have been imposed by material on an opposite side 134.1 of the trench 130.1 (and vice versa). The trenches 130.1, 130.2 may be formed near select circuit components 120 to isolate them from mechanical strains that may arise elsewhere on the IC 100; therefore, for convenience, these select components 120 are called "protected components" herein. The protected circuit components 120 may be connected to other circuit components (not shown) on the semiconductor die 110 which may be located either on a common side of the trench 130.1 as the protected components 120 or on an opposite side of the trench as the protected components 120. The protected circuit components may be provided in the semiconductor die 110, on a surface of the semiconductor die 110 or above the semiconductor die (e.g., in the protective layer 150).

The trenches 130.1, 130.2 may be filled with a fill material 140 that has a lower bulk modulus (higher compressibility) than that of a modulus of the semiconductor die material. The fill material 140 in the trenches 130.1, 130.2 may absorb stress that is applied to the semiconductor die 110. The stress may be due to the materials in the IC 100 having different coefficients of thermal expansion. For example, stress applied to the semiconductor die 110 may be due to the encapsulating material 160.1, components 120, and the semiconductor die 110 having different coefficients of thermal expansion. Similarly, other materials or components on the semiconductor die 110 which have different coefficients of thermal expansion may cause stresses to be applied to IC 100 and/or the semiconductor die 110. The trenches 130.1, 130.2 may be provided near or around the components that cause stresses to be applied to the semiconductor die 110 or may be provided near or around the components to be protected from the stresses.

When strain forces are applied in a particular area of the semiconductor die 110, the trenches 130.1, 130.2 may prevent strain forces on one side of the trench from reaching the other side of the trench. With respect to the protected components 120, strain forces that arise at a first side 134.1 of trench 130.1 are diminished (or eliminated altogether) at a second side 132.1 of the trench. Similarly, for trench 130.2, strain forces that arise at a first side of the 132.2 of the trench 130.2 are diminished or eliminated at a second side 134.2 of the trench. Because the protected components 120 are located between side 132.1 of trench 130.1 and side 134.2 of trench 130.2, the protected components 120 are protected against strain forces that originated elsewhere on the die 110.

Additional circuit components (not shown) within the IC 100 may be electrically connected to the sensitive circuit components 120. The IC 100 may include one or more protective layer(s) 150 deposited on a semiconductor die 110. In various embodiments, the material of the semiconductor die 110 may be comprised of silicon, germanium, or other semiconductor material. The protective layer(s) 150 may be one or more of an oxide layer, a silicon nitride layer, a nitride layer and an oxide nitride layer.

The IC 100 may be encapsulated with an encapsulating material 160.1 on one side of the IC and encapsulating material 160.2 on the opposite side of the IC, such as plastic. The encapsulating material 160.1 and 160.2 may encapsulate the IC on all sides. In an embodiment, a lead frame 170 may be included between the encapsulating material 160.2 and the semiconductor material die 110. In another embodiment, the lead frame 170 alone may be beneath the semiconductor die 110 with no encapsulating material 160.2 at its opposite surface. The configuration of the sensitive circuit components 120, protective layers 150, semiconductor die 110, encapsulating material 160.1 and 160.2, and lead frame 170 may vary from design to design. For purposes of the present discussion, it is sufficient to discuss relationships between these elements 110-170 and the trenches 130.1, 130.2 described herein.

The trenches 130.1, 130.2 and fill material 140 may provide physical isolation for the electrically sensitive circuit components 130 from surrounding protective layer(s) 150 and semiconductor die 110. The physical isolation may provide relief from various directionally-related stresses exerted on the IC 100. For example, the trenches 130.1, 130.2 as formed along a Y-axis (not shown) in FIG. 1 may provide relief for the components 120 from stresses along an X-axis (called "X-X" stresses, which are caused by mechanical stresses on the IC 100 along the X-axis). For the X-X stresses, the sides of the trenches 130.1, 130.2 may compress along the X-axis toward the circuit components 120. Portions of the fill material 140 deposited within the trenches 130.1, 130.2 may absorb the compressive stress, thereby isolating the sensitive circuit components 120 from the X-axis compressive stress. Thus, electrical variations in the operating characteristics of the sensitive circuit components 120 may be minimized for X-X stresses. Although not shown in FIG. 1, trenches may also be formed along the X-axis to provide relief for mechanical stresses on the IC 100 along the Y-axis.

For mechanical strains along a Z-axis (called "Z-Z" stresses, which are caused by mechanical stresses on the IC 100 along the Z-axis), a portion of the fill material 120 deposited above the sensitive circuit components 130 may absorb stress along the Z-axis between the encapsulating material 160.1 and the protective layer(s) 150. According to various embodiments, trenches may be formed in the IC 100 in a variety of configurations to provide strain relief for mechanical stresses along the X, Y, or Z axes. Various trench shapes are described in more detail below.

As illustrated in FIG. 1(B), the trenches 130.1, 130.2 may extend through the one or more protective layer(s) 150 and into the semiconductor die 110 at a predetermined depth D. The depth D may be formed in a trench etching process during manufacture of the IC 100. The depth D may be measured from the top of the protective layer(s) 150. The trenches 130.1, 130.2 may have a width W. Although the bases of the trenches 130.1, 130.2 as illustrated in FIGS. 1(A), 1(B) are shown as being squared, the bases may also be rounded.

The depth D of the trenches 130.1, 130.2 may be based on a number of electrically sensitive circuit components 120 and/or the size of the components 120 to be isolated within the IC 100. The depth D may be varied based on an etching time for the trenches 130.1, 130.2. Ideally, the optimal trench depth D may extend into the semiconductor die 110 and may be bottomed below the sensitive circuit components 120 to maximize isolation of the components 120. However, the trench depth D may be increased corresponding to an increased number and/or size of the components 120 to be isolated within the IC 100.

Further, certain design tradeoffs may be considered when determining trench depth. For example, a deeper trench depth D will require more fill material 140 than a shallower trench depth, which may increase manufacturing costs per unit IC package. Moreover, fill material 140 typically may be applied during a spinning process that spins the IC 100 as fill material 120 is deposited onto the IC 100. The fill material 140 may spread along the IC 100 and fill the trenches 130.1, 130.2. Ideally, the fill material 140 should uniformly fill the trenches 130.1, 130.2 to a fill level approximately equal to the top of the protective layers 150. However, for deeper trench depths D, the fill material 140 may not uniformly fill the trenches 130.1, 130.2 to the ideal fill level during the spinning process. This may allow encapsulating material 160.1 to seep into the trenches 130.1, 130.2. As noted above, allowing encapsulating material 160.1 into the trenches may degrade strain relief for the sensitive circuit components 120.

Figure 2:
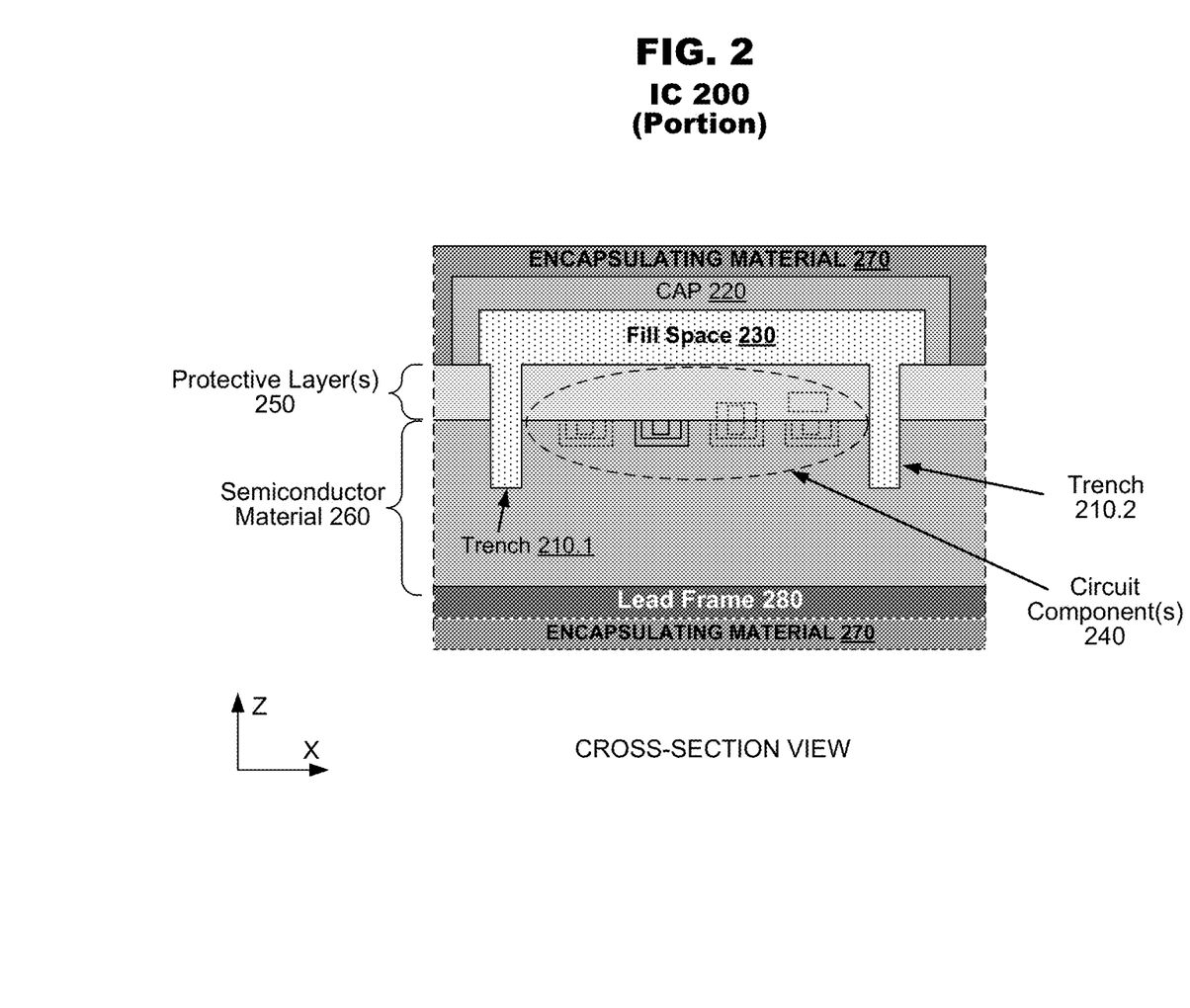
FIG. 2 illustrates an IC having a localized trench and cap configuration formed near one or more circuit component(s) according to an embodiment of the present invention.

FIG. 2 illustrates an IC 200 having a localized trench and cap configuration formed near one or more circuit component(s) according to an embodiment of the present invention.

As illustrated in FIG. 2, a portion of the IC 200 may have one or more trenches 210.1, 210.2 formed near electrically sensitive circuit components 240. The IC 200 may include one or more protective layers 250 deposited on a semiconductor material 260. A cap 220 may cover the trenches 210.1, 210.2 and the corresponding sensitive circuit components 240. The cap 220 may be bonded to the protective layers 250 of the IC 200. The area beneath the cap 220 and within the trenches 210.1, 210.2 may include a fill space 230. In an embodiment, the fill space may be filled with a gas or air. In another embodiment, the fill space 230 may be placed under a vacuum. In yet another embodiment, the fill space may be partially filled with a liquid, gel or other material having a lower bulk modulus than the protective layers 250 and/or the semiconductor material 160. The protective layer(s) 250 may be one or more of an oxide layer, a silicon nitride layer, a nitride layer and an oxide nitride layer.

The IC 200 may be encapsulated with an encapsulating material 270, such as plastic. In an embodiment, a lead frame 280 may be included between the encapsulating material 270 and the semiconductor material 260. In another embodiment, the lead frame 280 alone may be beneath the semiconductor material 260 with no encapsulating material 270 at its opposite surface.

Combining the cap 220 with the trenches 210.1, 210.2 may further improve isolation for the circuit components 240 over the configuration of trenches 110.1, 110.2 and fill material 120 of FIG. 1. For example, the trenches 210.1, 210.2 shown in FIG. 2 are formed along a Y-axis (not shown). For mechanical stresses exerted on the IC 200 along an X-axis, the sides of the trenches 210.1, 210.2 along the X-axis may compress. However, the fill space 230 may provide isolation for the sensitive circuit components 240 from the stresses. A similar isolation may be obtained for mechanical stresses exerted on the IC 200 along a Z-axis. Similarly, one or more trench(es) formed along the X-axis may provide isolation for the sensitive circuit components 240 for mechanical stresses exerted on the IC 200 along the Y-axis.

Although a trench and cap configuration as illustrated in FIG. 2 may provide mechanical strain relief improvements over a trench and fill material configuration as illustrated in FIG. 1, the cap 220 may occupy more surface area of the protective layers 250 of the IC 200. Thus, circuit sizing and layout considerations of an IC may limit application of a trench and cap configuration.

Figure 3:
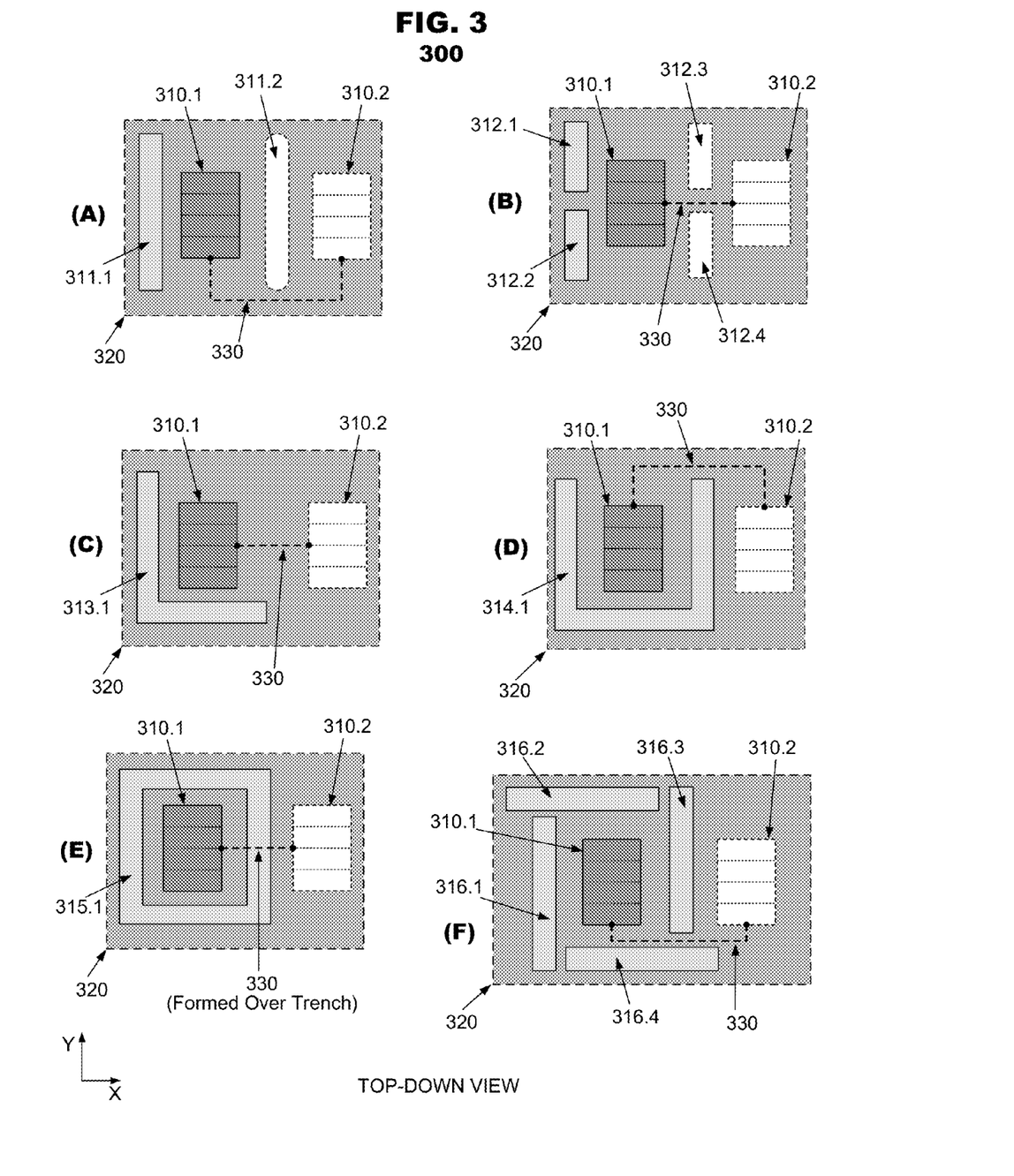
FIG. 3 illustrates top-down views of exemplary trench configurations for one or more electrically sensitive circuit components according to an embodiment of the present invention.

FIG. 3 illustrates top-down views of exemplary trench configurations 300 for one or more electrically sensitive circuit components 310.1 according to an embodiment of the present invention. The sensitive circuit components 310.1 may be formed on a die 320. Any of the trench configurations 300 may be filled with a fill material (not shown) as discussed previously. The sensitive circuit components 310.1 may be connected to additional circuit components 310.2 formed on the die 320 via connections 330. Any of the trench configurations 300 may be combined with a cap, e.g., cap 220 of FIG. 2, to further improve strain relief for the sensitive circuit components 310.1.

The various trench configurations 300 as illustrated in FIG. 3 may provide improvements or drawbacks over one another. Various design considerations may be weighed to determine an optimal trench configuration including: desired isolation for the sensitive circuit components 310.1 (i.e., for more sensitive components, isolation along more directional axes may be desired), placement of connections 330 to connect to the sensitive circuit components 310.1 to the additional circuit components 310.2, available area for trench placement, size and/or number of sensitive circuit components 310.1 to be isolated, IC packaging considerations, manufacturing costs, etc.

Generally, a trench formed along a major directional axis may provide relief for mechanical stresses exerted on the die 320 that are not parallel to the major axis. For example, a trench formed along a Y-axis may provide relief for mechanical stresses that are exerted on the die 320 along an X-axis.

As illustrated in FIG. 3(A), a first "line" trench 311.1 may be formed as a line near a side of the sensitive circuit components 310.1. In an embodiment, a second line trench 311.2 may be formed along an opposite side of the circuit components 310.1. As shown by the second line trench 311.2, the ends of a trench may be rounded or curved rather than squared. The sensitive circuit components 310.1 may be connected to the additional circuit components 310.2 via the connections 330, which may be routed around the second line trench 311.2, if present. In various embodiments, line trenches may be formed along any side of the circuit components to provide relief for mechanical stresses exerted on the die 320 along various directional axes of the die 320, as described above.

FIG. 3(B) illustrates a pair of line trenches 312.1, 312.2 that may be formed near a side of the sensitive circuit components 310.1. In an embodiment, a second pair of line trenches 312.3, 312.4 may be formed along an opposite side of the circuit components 310.1. The sensitive circuit components 310.1 may be connected to the additional circuit components 310.2 via the connections 330, which may be routed between (or around) the second pair of line trenches 312.3, 312.4, if present. In various embodiments, any number of line trenches may be formed along any side of the circuit components to provide relief for mechanical stresses exerted on the die 320 along various directional axes as described above.

FIG. 3(C) illustrates an "L-trench" 313.1 that may be formed along two sides near the sensitive circuit components 310.1. The sensitive circuit components 310.1 may be directly connected to the additional circuit components 310.2 via the connections 330. The L-trench 313.1, as illustrated in FIG. 3(C), may provide relief for mechanical stresses exerted on the die 320 along the X-axis and Y-axis. In various embodiments, an L-trench may be formed across any two sides of corresponding components.

FIG. 3(D) illustrates a "U-trench" 314.1 that may be formed along three sides near the sensitive circuit components 310.1. The U-trench 314.1, as illustrated in FIG. 3(D), may provide relief for stresses exerted on the die 320 along the X and Y-axes. As compared to the L-trench 313.1, the U-trench 314.1 may provide improved relief over the L-trench 313.1 for mechanical stresses exerted on the die 320 along the X-axis. However, the U-trench 314.1 may occupy more area around the sensitive circuit components 310.1, which may be needed to form the U-trench 314.1. Further, connections 330, which may only be routed around one side of the sensitive circuit components 310.1 may impact design considerations for connections to the additional circuit components 310.2.

FIG. 3(E) illustrates an annular trench 315.1 which may be formed along four sides near the sensitive circuit components 310.1. The annular trench 315.1 may provide a maximum isolation for the circuit components 310.1 for mechanical stresses exerted on the die 320 along both the X-axis and Y-axis. However, the annular trench 315.1 may sever connections (which may be formed before the trench 315.1 may be etched) between the sensitive circuit components 310.1 and the additional circuit components 310.2. The connections 330 may be re-formed following etching of the annular trench 315.1, however, re-forming the connections may increase manufacturing costs.

FIG. 3(F) illustrates "gapped" annular trenches 316.1, 316.2, 316.3, and 316.4 which may be formed along four sides near the sensitive circuit components 310.1. The gapped annular trenches 316.1-316.4 may provide similar isolation as the annular trench 314.1 for mechanical stresses exerted on the die along the X-axis and the Y-axis, however, the gapped annular trenches 316.1-316.4 may eliminate the need for re-forming the connections 330 to connect to the additional circuit components 310.2. Thus, manufacturing costs may be reduced for the gapped annular trench 316.1 over those of the annular trench 315.1.

It is noted that the trench configurations 300 illustrated in FIG. 3 do not represent an exhaustive list of possible configurations. Similarly, the connections 330 may be provided at any appropriate point to the sensitive circuit components 310.1, as determined by a circuit designer.

Figure 4:
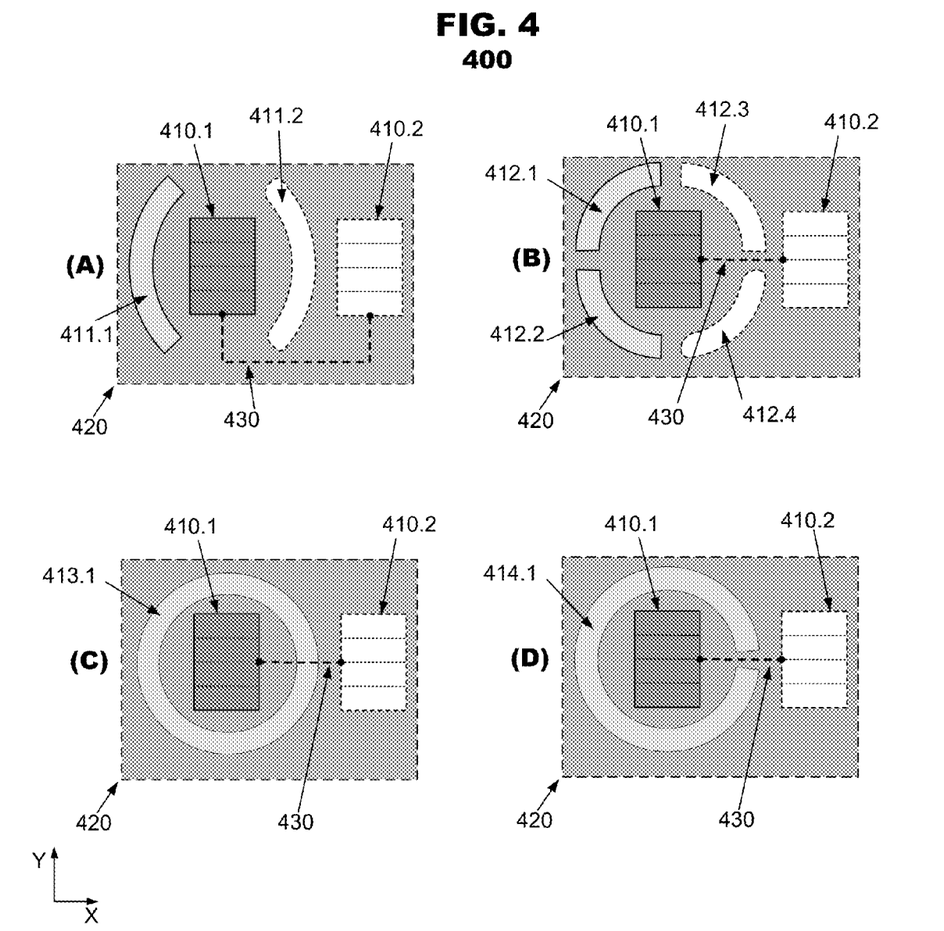
FIG. 4 illustrates top-down views of additional exemplary trench configurations for one or more electrically sensitive circuit components according to an embodiment of the present invention.

FIG. 4 illustrates top-down views of additional exemplary trench configurations 400 for one or more electrically sensitive circuit components 410.1 according to an embodiment of the present invention. The sensitive circuit components 410.1 may be formed on a die 420. The exemplary trench configurations 400 illustrate that the use of curved trenches may be within the scope of the present invention. Any of the trench configurations 400 may be filled with a fill material (not shown) as discussed previously. The sensitive circuit components 410.1 may be connected to additional circuit components 410.2 formed on the die 420 via connections 430. Any of the trench configurations 400 may be combined with a cap, e.g., cap 220 of FIG. 2, to further improve strain relief for the sensitive circuit components 410.1.

As illustrated in FIG. 4(A), a first "curved" trench 411.1 may be formed as a curve near a side of the sensitive circuit components 410.1. In an embodiment, a second curved trench 411.2 may be formed along an opposite side of the circuit components 410.1. As shown by the second curved trench 411.2, the ends of a trench may be rounded or curved rather than squared. The sensitive circuit components 410.1 may be connected to the additional circuit components 410.2 via the connections 430, which may be routed around the second curved trench 411.2, if present.

A curved trench, for example the first curved trench 411.1, may provide improvements over a line trench (i.e., line trench 311.1 of FIG. 1) by providing stress relief for multiple directional axes with a single curved trench. For example, the first curved trench 411.1 may provide stress relief for the sensitive circuit components 410.1 along both an X-axis and a Y-axis for such mechanical stresses that may be exerted on the die 420.

The amount of stress relief provided for a corresponding directional axis may be determined by the length of the first curved trench 411.1 along a side of the sensitive circuit components 410.1. A longer curve along a corresponding major directional axis, for example the Y-axis for the first curved trench 411.1, may provide greater stress relief for the sensitive circuit components 410.1 for mechanical stresses that may be exerted on the die 420 along the X-axis.

As illustrated in FIG. 4(A), the first curved trench 411.1 may also extend around the corners of the sensitive circuit components 410.1 into the X-axis. The extension of the first curved trench into the X-axis may provide stress relief for the sensitive circuit components 410.1 for mechanical stresses that may be exerted on the die 420 along the Y-axis. The first curved trench 411.1 may provide more stress relief for the sensitive circuit components for mechanical stresses exerted on the die 420 along the X-axis than the Y-axis. However, curved trenches may be formed along any side and of any length near the sensitive circuit components 410.1 to provide various amounts of strain relief for various axes as determined by a circuit designer and various design considerations as have been discussed herein.

As illustrated in FIG. 4(B), a plurality of curved trenches 412.1, 412.2, 412.3, and 412.4 may be provided around a gapped perimeter of the sensitive circuit components 410.1. The sensitive circuit components 410.1 may be connected to the additional circuit components 410.2 via the connections 430, which may be routed between (or around) additional curved trenches.

FIG. 4(C) illustrates a circular trench 413.1 which may be completely formed around a perimeter near the sensitive circuit components 410.1. The circular trench 413.1 may provide a maximum isolation for the circuit components 410.1 for mechanical stresses exerted on the die 420 along both the X-axis and Y-axis. However, the circular trench 413.1 may sever connections (which may be formed before the trench 413.1 may be etched) between the sensitive circuit components 410.1 and the additional circuit components 410.2. The connections 430 may be re-formed following etching of the circular trench 413.1, however, re-forming the connections may increase manufacturing costs.

FIG. 4(D) illustrates a gapped circular trench 414.1 which may be completely formed around three sides and partially formed around one side of the sensitive circuit components 410.1. The gapped circular trench 414.1, as illustrated in FIG. 4(C), may provide relief for mechanical stresses exerted on the die 420 along the X and Y-axes. The gapped circular trench 414.1 may provide relief similar to that of the circular trench 413.1, however, the connections 430 may be routed through the gap, which may minimize manufacturing costs over the circular trench 413.1. The gap may be of any width according to the various design considerations as discussed herein.

It is noted that the trench configurations 400 illustrated in FIG. 4 do not represent an exhaustive list of possible configurations. Similarly, the connections 430 may be provided at any appropriate point to the sensitive circuit components 410.1, as determined by a circuit designer.

FIG. 5(A) is a stress simulation graph 500 that shows a first pair of trenches 510.1, 510.2 formed along an X-axis (not shown) near an isolated circuit region 512 for a portion of an IC 520. The dashed line in FIG. 5(A) describes an approximate boundary between one or more protective layer(s) 530 and a semiconductor material 540 for the IC 520. The first pair of trenches 510.1, 510.2 are filled with a polyimide fill material 514. The polyimide fill material 514 fills the pair of trenches 510 and covers the top of the isolated circuit region 512. The polyimide fill material 514 has a lower bulk modulus than the protective layer(s) 530 and/or the semiconductor material 540.

FIG. 5(B) is another simulation graph 500 that shows a second pair of trenches 550.1, 550.2 formed along the X-axis near an isolated circuit region 552 for another portion of the IC 520. The dashed line in FIG. 5(B) similarly describes the approximate boundary between the protective layer(s) 530 and the semiconductor material 540 for the IC 520. The second pair of trenches 550.1, 550.2 are filled with an epoxy fill material 554. The epoxy fill material 554 also fills the trenches 520 and covers the top of the isolated circuit region 552. However, the epoxy fill material 554 has a higher bulk modulus than the polyimide fill material 514.

Figure 5:
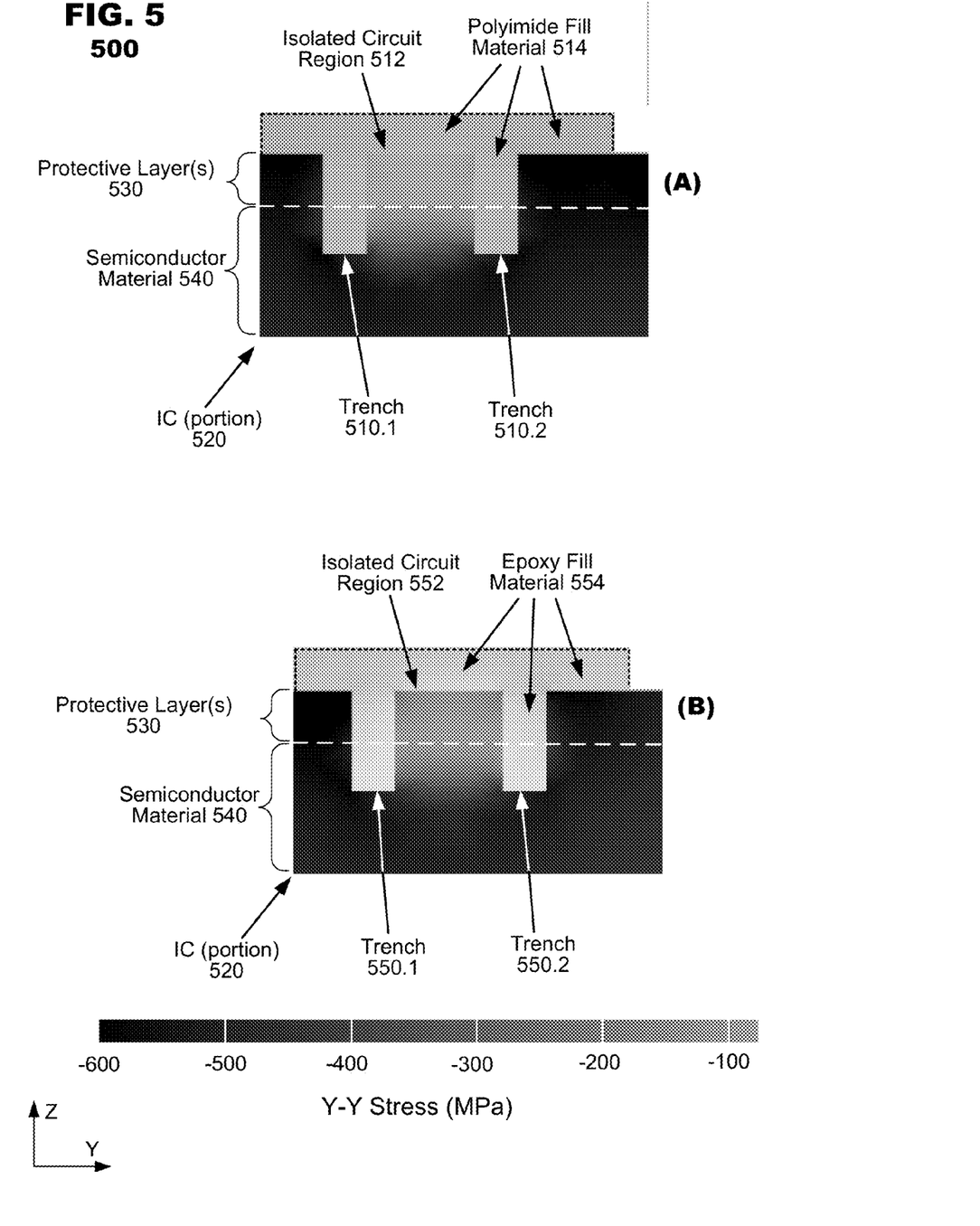
FIG. 5 shows a stress simulation graph for various trench and fill material configurations.

As illustrated each pair of trenches 510.1-510.2 and 550.1-550.2 are formed along the X-axis and therefore provide relief for mechanical stresses exerted on the IC 520 along the Y-axis, referred to here as a "Y-Y stress" for the simulation graph 500. The simulation parameters for the stress simulation graph 500 include heating the IC 520 to a temperature of 200° C. to simulate a molding or encapsulation process for the IC 520. The color scale indicates a range of Y-Y stresses that are measured about the IC 520 from approximately −100 to −600 MPa, which indicates that the IC 520 is under compression due to the temperature variations.

As illustrated in the graph 500, a majority of the protective layers 530 for the isolated circuit region 512 of FIG. 5(A) are under less Y-Y stress (lighter) than the protective layers 530 for the isolated circuit region 552 of FIG. 5(B), which is under more Y-Y stress (darker). Although graph 500 illustrates Y-Y stresses, similar results can be expected for X-X mechanical stresses on the IC 520 for trenches that may be formed along the X-axis.

Figure 6:
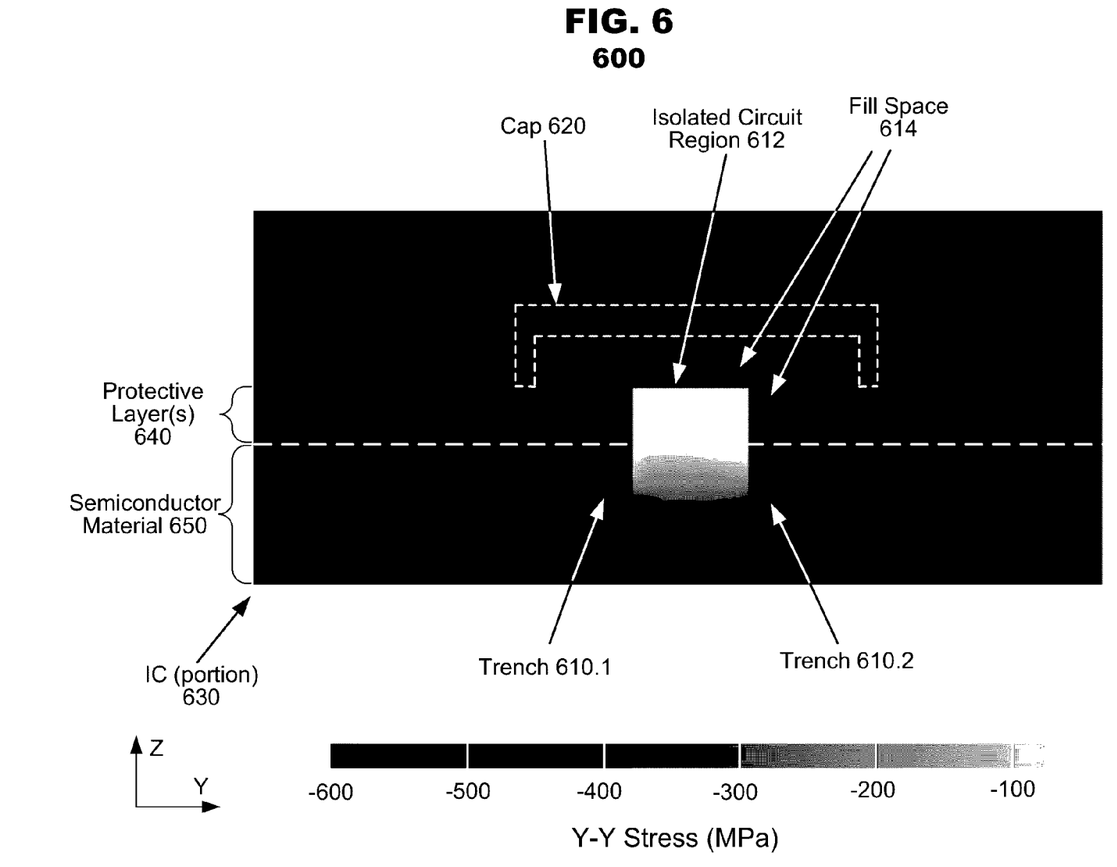
FIG. 6 shows a stress simulation graph for a trench and cap configuration as described in FIG. 2.

FIG. 6 shows a stress simulation graph 600 for a trench and cap configuration as described in FIG. 2. The stress simulation graph 600 shows an annular trench and cap configuration for an isolated circuit region 612 for a portion of an IC 630. The annular trench configuration includes a pair of trenches 610.1, 610.2 formed along an X-axis (not shown). The annular trench configuration also includes a pair of trenches formed along a Y-axis, however, these trenches are not visible in FIG. 6. The trenches 610.1, 610.2 may provide relief for mechanical stresses exerted on the IC 630 along the Y-axis, referred to here as Y-Y stress. The cap 620 may provide localized strain relief for the isolated circuit region along a Z-axis. For the simulation graph 600, a fill space 614 is filled with air. The dashed line in graph 600 describes an approximate boundary between one or more protective layer(s) 640 and a semiconductor material 650 for the IC 630.

As illustrated in the graph 600, Y-Y stress is minimized for a majority of the protective layer(s) 640 and the semiconductor material 650 for the isolated circuit region 612. The isolated circuit region 612 is under less Y-Y stress (lighter) than the isolated circuit regions 512 and 552 (darker) of FIG. 5.

Figure 7:
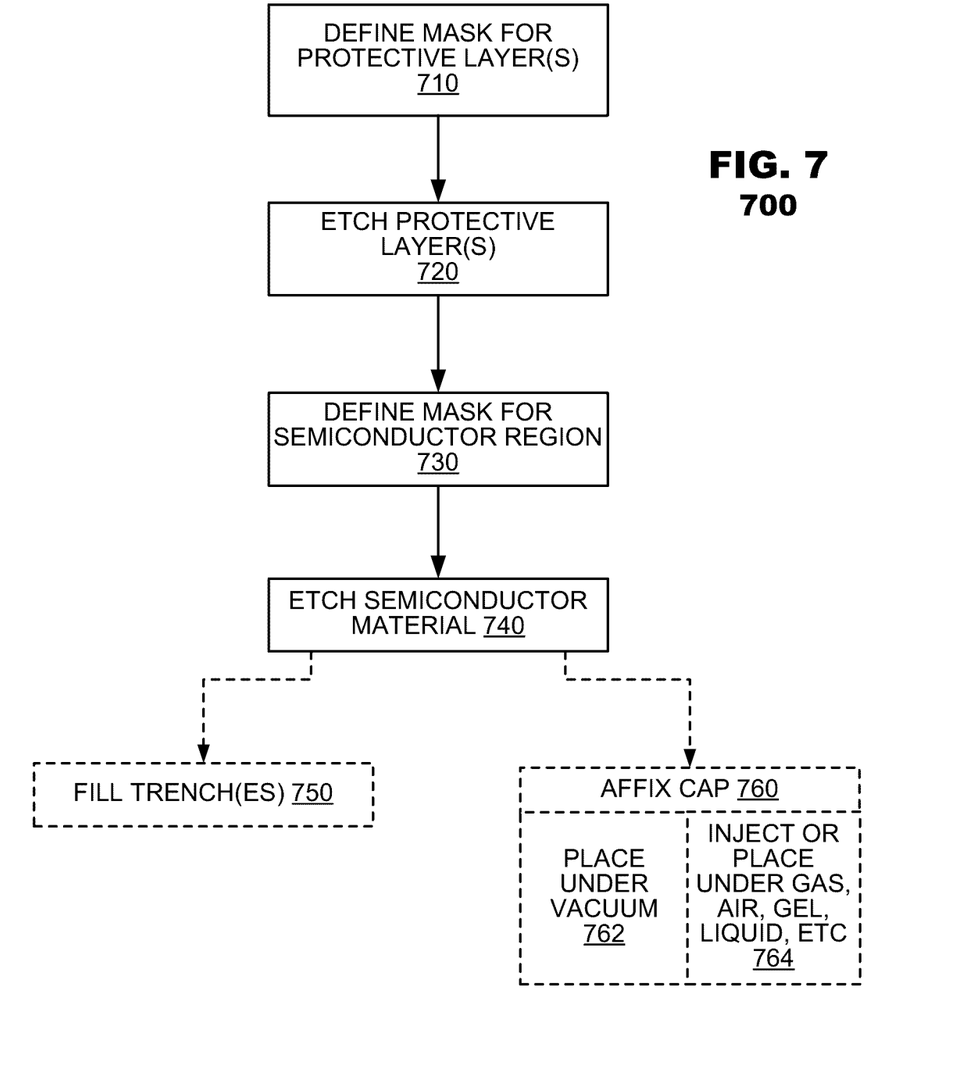
FIG. 7 illustrates a method for forming a trench near one or more sensitive circuit component(s) according to an embodiment of the present invention.

FIG. 7 illustrates a method 700 for forming a trench near one or more sensitive circuit component(s) according to an embodiment of the present invention. As illustrated in FIG. 7, the method 700 may include defining a trench mask for one or more protective layers 710 of an IC (block 710). At block 720, the method 700 may etch the one or more protective layers according to the trench mask. The method 700 may define a trench mask for a semiconductor material of the IC (block 730). At block 740, the method 700 may etch the semiconductor material according to the trench mask to a predetermined trench depth.

In an embodiment, the method 700 may fill one or more trench(es) with a fill material (block 750). In various embodiments, the fill material may be a material having a lower bulk modulus than the one or more protective layers and/or the semiconductor material. In another embodiment, the method 700 may affix a cap above one or more trench(es) (block 760). In such an embodiment, affixing the cap may be performed while placed in a vacuum (block 762) or a gas, air, liquid, gel or other material (block 764), such that the vacuum, gas, air, liquid, gel or other material is provided in the fill space beneath the cap and within the one or more of the trench(es). The gas, air, liquid, gel or other material may have a lower bulk modulus than the one or more protective layers and/or the semiconductor material. In another embodiment, the method may inject a gas, air, liquid, gel or other material having a lower bulk modulus than the one or more protective layers and/or the semiconductor material into a fill space beneath the cap and within the one or more trench(es) (block 764), or the method 700 may place the fill space under a vacuum (block 762).

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Although the processes illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

We claim:

1. An integrated circuit comprising:
   a semiconductor die having at least one trench formed in a surface of the semiconductor die, wherein the at least one trench is formed in a semiconductor material of the semiconductor die;
   one or more circuit components formed on the surface of the semiconductor die, wherein the trench extends into the semiconductor die next to at least one circuit component;
   a protective layer disposed over the surface of the semiconductor die;
   a cap disposed over the one or more circuit components to protect the one or more circuit components, the cap having a central portion defining a fill space between the central portion of the cap and the protective layer over the at least one circuit component, the central portion of the cap disposed over the fill space, the fill space extending into the at least one trench, the cap additionally having a peripheral portion extending from the central portion at an angle, the peripheral portion further defining and laterally adjacent to the fill space; and
   an encapsulating material disposed over the cap.

2. The integrated circuit of claim 1, further comprising a fill material disposed within the fill space in the at least one trench and between the cap and the semiconductor die.

3. The integrated circuit of claim 2, wherein the fill material has a lower bulk modulus than the semiconductor die.

4. The integrated circuit of claim 2, wherein the fill material is disposed above at least one of the circuit components.

5. The integrated circuit of claim 1, wherein a space in the at least one trench is filled with a gas.

6. The integrated circuit of claim 1, wherein a space in the at least one trench is under vacuum.

7. The integrated circuit of claim 1, wherein the protective layer includes the one or more circuit components.

8. The integrated circuit of claim 7, wherein the at least one trench in the semiconductor die extends through the protective layer.

9. The integrated circuit of claim 1, wherein the protective layer comprises at least one of an oxide layer, a silicon nitride layer, a nitride layer and an oxide nitride layer.

10. The integrated circuit of claim 1, wherein the encapsulating material covers the central portion and the peripheral portion of the cap.

11. The integrated circuit of claim 1, wherein the at least one trench extends into the semiconductor die such that the bottom of the at least one trench extends below at least one circuit component next to the at least one trench.

12. The integrated circuit of claim 1, wherein the at least one trench at least partially surrounds one or more of the circuit components.

13. The integrated circuit of claim 1, wherein: the circuit components include at least one sensitive circuit component; and the at least one trench extends into the semiconductor die next to the at least one sensitive circuit component.

14. The integrated circuit of claim 1, wherein from a top-down view the at least one trench surrounds the one or more circuit components on at least three sides.

15. The integrated circuit of claim 1, wherein from a top-down view the at least one trench includes a first trench on a first side of the one or more circuit components and a second trench on a second side of the one or more circuit components.

16. The integrated circuit of claim 15, wherein the first trench is arranged one of parallel to and perpendicular to the second trench.

17. The integrated circuit of claim 1, wherein the at least one trench includes a plurality of gapped trenches, and wherein a connecting line connecting the one or more circuit components enclosed by the plurality of gapped trenches to a component outside an area enclosed by the gapped trenches extends along a gap between at least two of the gapped trenches.

18. An integrated circuit comprising:
a semiconductor die;
one or more circuit components formed on a surface of the semiconductor die or above the semiconductor die;
a protective layer disposed above the surface of the semiconductor die, wherein the protective layer and the semiconductor die include at least one trench that extends through the protective layer and through a semiconductor material of the semiconductor die to a predetermined depth in the semiconductor die;
a cap disposed above the protective layer, the at least one trench and at least one circuit components, the cap having a central portion defining a fill space between the central portion of the cap and the protective layer over the one or more circuit components, the central portion of the cap disposed over the fill space, the fill space extending into the at least one trench, the cap additionally having a peripheral portion extending from the central portion at an angle, the peripheral portion further defining and laterally adjacent to the fill space; and
an encapsulating material disposed over the cap.

19. The integrated circuit of claim 18, wherein the protective layer comprises at least one of an oxide layer, a silicon nitride layer, a nitride layer and an oxide nitride layer.

20. The integrated circuit of claim 18, wherein the fill space between the central portion of the cap and the protective layer and in the at least one trench is filled with a material having a lower bulk modulus than the protective layer and the semiconductor die.

21. An integrated circuit comprising:
a semiconductor die;
one or more sensitive circuit components formed on or near a surface of the semiconductor die;
a trench extending into the semiconductor die adjacent the one or more sensitive circuit components;
a protective layer disposed over the surface of the semiconductor die; and
a cap disposed over the one or more sensitive circuit components to protect the one or more sensitive circuit components, the cap having a central portion defining a fill space between the central portion of the cap and the surface of the semiconductor die over the one or more sensitive circuit components, the central portion of the cap disposed over the fill space, the fill space extending into the trench, the cap additionally having a peripheral portion extending from the central portion at an angle, the peripheral portion further defining and laterally adjacent to the fill space, the fill space being filled with a filler material and configured to mechanically isolate the one or more sensitive circuit components from mechanical stresses on the semiconductor die; and
an encapsulating material disposed over the cap.

22. The integrated circuit of claim 21, wherein the filler material has a lower bulk modulus than the protective layer and the semiconductor die.

23. The integrated circuit of claim 21, wherein the fill space is disposed between the protective layer and the central portion of the cap.

24. The integrated circuit of claim 21, wherein the filler material comprises a gas, a liquid, or a gel.

25. The integrated circuit of claim 24, wherein the filler material comprises air.

26. The integrated circuit of claim 21, wherein the cap is bonded to a layer of the semiconductor die.

* * * * *